(12) United States Patent
Chae et al.

(10) Patent No.: US 7,420,213 B2
(45) Date of Patent: Sep. 2, 2008

(54) THIN FILM TRANSISTOR ARRAY SUBSTRATE HAVING MAIN GATE INSULATING FILM FORMED OF ORGANIC MATERIAL AND SUB GATE INSULATING FILM FORMED OF FERROELECTRIC MATERIAL AND FABRICATING METHOD THEREOF

(75) Inventors: Gee Sung Chae, Incheon (KR); Jae Seok Heo, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 11/410,212

(22) Filed: Apr. 25, 2006

(65) Prior Publication Data
US 2007/0138476 A1 Jun. 21, 2007

(30) Foreign Application Priority Data
Dec. 15, 2005 (KR) .................... 10-2005-0123872

(51) Int. Cl.
*H01L 27/14* (2006.01)
*H01L 29/04* (2006.01)
*H01L 29/15* (2006.01)
*H01L 31/036* (2006.01)

(52) U.S. Cl. ......................... 257/72; 257/59
(58) Field of Classification Search ............. 257/59, 257/72
See application file for complete search history.

(56) References Cited

U.S. PATENT DOCUMENTS

| 5,756,372 A * | 5/1998 | Wakui et al. ............. 438/30 |
|---|---|---|
| 6,081,308 A * | 6/2000 | Jeong et al. ............. 349/42 |
| 6,088,072 A * | 7/2000 | Lee ...................... 349/39 |
| 6,225,655 B1 * | 5/2001 | Moise et al. ............. 257/295 |
| 6,400,425 B1 * | 6/2002 | Kim et al. ................ 349/40 |
| 6,806,933 B2 * | 10/2004 | Ko ....................... 349/139 |
| 6,833,896 B2 * | 12/2004 | Lee ...................... 349/141 |
| 7,173,683 B2 * | 2/2007 | Hur et al. ................ 349/147 |
| 2001/0023080 A1* | 9/2001 | Koo ..................... 438/3 |
| 2002/0074592 A1* | 6/2002 | Abedifard ............... 257/315 |
| 2003/0102471 A1* | 6/2003 | Kelley et al. ............. 257/40 |
| 2004/0129937 A1* | 7/2004 | Hirai ..................... 257/40 |
| 2004/0129978 A1* | 7/2004 | Hirai ..................... 257/347 |

\* cited by examiner

*Primary Examiner*—Jerome Jackson
*Assistant Examiner*—Anthony Ho
(74) *Attorney, Agent, or Firm*—Morgan, Lewis & Bockius LLP

(57) ABSTRACT

A thin film transistor array substrate is provided. The thin film transistor array substrate includes a substrate; a gate pattern of a gate electrode and a gate line connected to the gate electrode on the substrate; a main gate insulating film formed of an organic material to cover the gate pattern; a semiconductor pattern overlapping the gate line such that the main gate insulating film is disposed between semiconductor patter and the gate line; a source/drain pattern on the semiconductor pattern. The source/drain pattern has a data line crossing the gate line with the main gate insulating film therebetween, a source electrode and a drain electrode, Here, the source electrode, the drain electrode and the semiconductor pattern define a thin film transistor disposed at the intersection between the gate line and the data line. The thin film transistor array substrate further includes a protective film defining a contact hole at a portion of the drain electrode; a pixel electrode contacting the drain electrode through the contact hole; and a sub gate insulating pattern disposed between the gate pattern and the main gate insulating film overlapping the gate pattern. The sub gate insulating pattern includes a ferroelectric material.

9 Claims, 10 Drawing Sheets

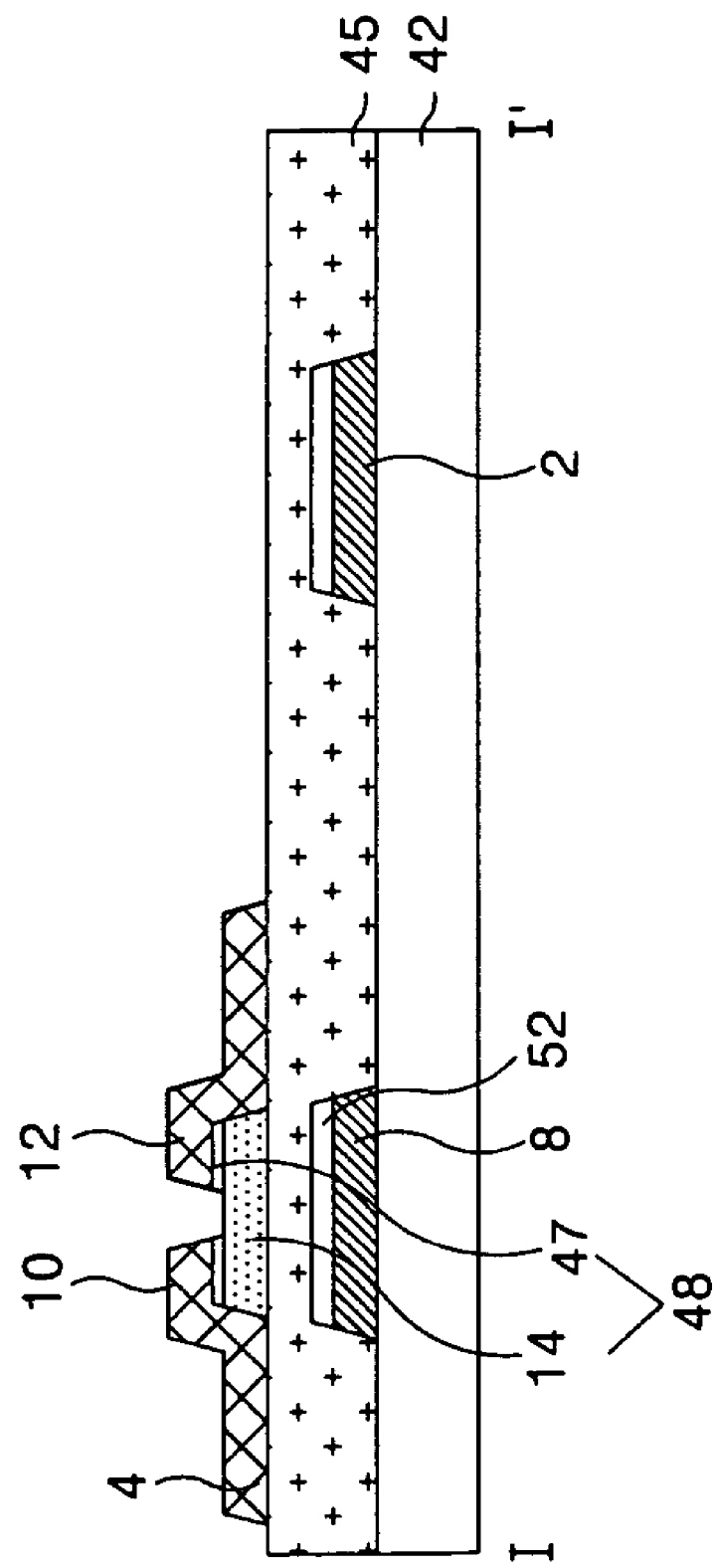

THIN FILM TRANSISTOR ARRAY SUBSTRATE HAVING MAIN GATE INSULATING FILM FORMED OF ORGANIC MATERIAL AND SUB GATE INSULATING FILM FORMED OF FERROELECTRIC MATERIAL AND FABRICATING METHOD THEREOF

This application claims the benefit of Korean Patent Application No. P2005-0123872 filed in Korea on Dec. 15, 2005, which is hereby incorporated by reference.

BACKGROUND OF THE INVENTION

1. Field of the Invention

The present invention relates to a thin film transistor array substrate, and more particularly, to a thin film transistor array substrate and a fabricating method thereof to provide improved picture quality.

2. Description of the Related Art

Generally, a liquid crystal display (LCD) controls the light transmittance of a liquid crystal using an electric field to display a picture. The LCD includes a liquid crystal display panel having liquid crystal cells arranged in a matrix, and a driving circuit for driving the liquid crystal display panel. The liquid crystal display panel includes a thin film transistor array substrate and a color filter array substrate opposed to each other, a liquid crystal injected between two substrates, and a spacer for keep a cell gap between the two substrates.

The thin film transistor array substrate comprises gate lines, data lines crossing the gate lines, thin film transistors, pixel electrodes formed for each liquid crystal cell and connected to the thin film transistor, and alignment films coated thereon. The thin film transistors serve as switching devices and are disposed at each intersection of the gate lines and the data lines. The gate lines and the data lines receive signals from the driving circuits via each pad portion. The thin film transistor applies a pixel signal fed to the data line to the pixel electrode in response to a scanning signal fed to the gate line. The color filter array substrate comprises color filters formed for each liquid crystal cell, black matrices for dividing color filters and reflecting an external light, common electrodes for commonly applying reference voltages to the liquid crystal cells, and an alignment film coated thereon. The liquid crystal display panel is formed by preparing the thin film array substrate and the color filter array substrate individually to join them. A liquid crystal is then injected between the joined substrates and sealed to complete the liquid crystal display panel.

FIG. 1 is a plan view illustrating a general thin film transistor array substrate, and FIG. 2 is a sectional view of a related art thin film transistor array substrate taken along line I-I' of FIG. 1. As shown in FIGS. 1 and 2, the thin film transistor array substrate includes a gate line 2 and a data line 4 provided on a lower substrate 42 intersecting each other with the gate insulating film 44 therebetween, a thin film transistor 6 provided at each intersection, and a pixel electrode 18 provided at a cell area having a crossing structure. Further, the thin film transistor array substrate includes a storage capacitor 20 provided at an overlapped portion between the pixel electrode 18 and the pre-stage gate line 2.

The thin film transistor 6 includes a gate electrode 8 connected to the gate line 2, a source electrode 10 connected to the data line 4, a drain electrode 12 connected to the pixel electrode 16, and an active layer 14 overlapping the gate electrode 8 and defining a channel between the source electrode 10 and the drain electrode 12. The active layer 14 is partially overlapped by the source electrode 10 and the drain electrode 12, and further includes a channel portion between the source electrode 10 and the drain electrode 12. An ohmic contact layer 47 for making an ohmic contact with the source electrode 10 and the drain electrode 12 is further formed on the active layer 14. Herein, the active layer 14 and the ohmic contact layer 47 form a semiconductor pattern 48.

The thin film transistor 6 allows a pixel voltage signal applied to the data line 4 to be charged into the pixel electrode 18 and held in accordance with a gate signal applied to the gate line 2. The pixel electrode 18 is connected to the drain electrode 12 of the thin film transistor 6 via a first contact hole 16 passing through a protective film 50. The pixel electrode 18 generates a potential difference with respect to a common electrode provided at an upper substrate (not shown) by the charged pixel voltage signal. This potential difference rotates the liquid crystal positioned between the thin film transistor array substrate and the upper substrate due to a dielectric anisotropy and transmits input light via the pixel electrode 18 from a light source (not shown) toward the upper substrate.

The storage capacitor 20 comprises the pre-stage gate line 2, and the pixel electrode 18 overlapping the gate line 2 with the gate insulating film 44 and the protective film 50 therebetween. The storage capacitor 20 allows a pixel voltage charged in the pixel electrode 18 to be stably maintained until the next pixel voltage is charged. The gate line 2 is connected to a gate driver via a gate pad portion (not shown). The data line 4 is connected to a data driver via a data pad portion (not shown).

In the thin film transistor array substrate having the foregoing structure, an inorganic insulating film, such as $SiN_x$, is formed using at least two deposition processes, such as PECVD or sputtering, thereby providing the gate insulating film 44. However, the inorganic insulating film covering the gate electrode 8 and the gate line 2 positioned at the lower portion creates a step profile along the entire length. The step profile reduces the degree of flatness of the thin film transistor array substrate.

Accordingly, as shown in FIG. 3, a technique such that a gate insulating film 43 is formed from an organic material has been suggested. Unlike the inorganic gate insulating film 44 where the inorganic material is coated and dried by a deposition technique, such as PECVD or sputtering, the organic material is coated and undried by a coating technique, such as a spin coating or a spinless coating, to form the organic gate insulating film 43. Accordingly, the inorganic gate insulating film 44, the organic gate insulating film 43 removes step coverage provided by the gate electrode 8 and the gate line 2. Also, the organic gate insulating film 43 has a more simple manufacturing process than the inorganic gate insulating film 44 provided by two deposition processes and is lower in cost. However, the organic gate insulating film 43 has a drawback in that a dielectric constant contrast of a same thickness is smaller than the inorganic gate insulating film 44. This difference in the dielectric constant allows a value of a feed-through voltage $\Delta V_p$ to be increased so that a deterioration of a picture quality results.

A driving characteristic of the TFT array substrate will now be described with reference to FIG. 4. First, the gate electrode 8 of the TFT 6 is supplied with a gate voltage ($V_g$) and the source electrode 10 thereof is supplied with a data voltage $V_d$. If a gate voltage $V_g$ greater than a threshold voltage is applied to the gate electrode 8 of the TFT 6, then a channel is formed between the source electrode 10 and the drain electrode 12. Then, the data voltage $V_d$ is charged, via the source electrode 10 and the drain electrode 12 of the TFT 6, into the liquid crystal cell ($C_{lc}$) and the storage capacitor ($C_{st}$) 20.

A feed-through voltage $\Delta V_p$, that is, a difference between the data voltage $V_d$ and a voltage $V_{lc}$ charged in the liquid crystal cell $C_{lc}$ is defined by equation (1) below.

$$\Delta V_p = \frac{C_{st}}{C_{gd} + C_{lc} + C_{st}} \Delta V_g \quad (1)$$

Here, $C_{gd}$ is a parasitic capacitance formed between the gate electrode and the drain electrode (or source electrode) of the TFT, $C_{lc}$ is a capacitance of the liquid crystal cell, $C_{st}$ is a capacitance of the storage capacitor, and $\Delta V_g$ is a difference voltage between a gate high voltage $V_{gh}$ and a gate low voltage $V_{gl}$. Further, the capacitance C of the capacitor is proportional to $\epsilon$ (dielectric constant) according to equation (2) below.

$$C = \varepsilon \frac{d}{A} \quad (2)$$

Here, $C_{gd}$ is proportional to a dielectric constant $\epsilon$ of the gate insulating film 43 or 44. A dielectric constant $\epsilon$ of an inorganic material, such as $SiN_x$, is approximately 6-8 while a dielectric constant $\epsilon$ of an organic material is approximately 3-4.

As a result, if the gate insulating film 43 is formed from an organic material instead of an inorganic material, then flattening can be achieved more simply and the value of $C_{gd}$ is decreased. Thus, there is a further result in that $\Delta V_p$ is larger. Accordingly, a deterioration of picture quality, such as flicker, occurs.

SUMMARY OF THE INVENTION

Accordingly, the present invention is directed to a thin film transistor array substrate and fabricating method thereof that substantially obviates one or more of the problems due to limitations and disadvantages of the related art.

Accordingly, an object of the present invention is to provide a thin film transistor array substrate and a fabricating method thereof that improve picture quality and increase a capacitance of a storage capacitor.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the invention, as embodied and broadly described, a thin film transistor array substrate comprises a substrate; a gate pattern on the substrate, the gate pattern including a gate electrode and a gate line connected to the gate electrode; a main gate insulating film formed of an organic material to cover the gate pattern; a semiconductor pattern overlapping the gate electrode such that the main gate insulating film is disposed between semiconductor patter and the gate line; a source/drain pattern on the semiconductor pattern, the source/drain pattern including a data line crossing the gate line with the main gate insulating film therebetween, a source electrode and a drain electrode, wherein the source electrode, the drain electrode and the semiconductor pattern define a thin film transistor provided at the intersection between the gate line and the data line; a protective film having a contact hole at a portion of the drain electrode; a pixel electrode contacting the drain electrode through the contact hole; and a sub gate insulating pattern disposed between the gate pattern and the main gate insulating film overlapping the gate pattern, the sub gate insulating pattern including a ferroelectric material.

In another aspect, a method of fabricating a thin film transistor array substrate comprises forming a gate pattern on a substrate, the gate pattern including a gate electrode and a gate line connected to the gate electrode, forming a sub gate insulating pattern of a ferroelectric material on the gate pattern; forming a main gate insulating film of an organic material to cover the gate pattern and the sub gate insulating pattern; forming a semiconductor pattern on the main gate insulating film partially overlapping the sub gate insulating pattern; forming a source/drain pattern on the semiconductor pattern, the source/drain pattern including a data line crossing the gate line with the main gate insulating film therebetween, a source electrode connected to the semiconductor pattern and the data line, and a drain electrode connected to the semiconductor pattern at a portion separate from the source electrode; forming a protective film defining a contact hole at a portion of the drain electrode; and forming a pixel electrode contacting the drain electrode through the contact hole.

In another aspect, a thin film transistor array substrate comprises a gate line; a main gate insulating film formed over the gate line; a data line formed on the main gate insulating film crossing the gate line such that the main gate insulating film is disposed between the gate line and the data line; a thin film transistor provided at the intersection of the gate line and the data line, the transistor including a gate electrode extended from the gate line, a semiconductor pattern overlapping the gate electrode with the main gate insulating pattern disposed between the gate electrode and the semiconductor pattern, a source electrode connected to the data line the semiconductor pattern, and a drain electrode connected to the semiconductor pattern at a portion separate from the source electrode; a pixel electrode connected to the drain electrode of the thin film transistor; and a sub gate insulating pattern disposed between the gate pattern and the main gate insulating film overlapping the gate pattern, the sub gate insulating pattern including a ferroelectric material.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings:

FIGS. 6A to 6E are diagrams showing an exemplary process for fabricating the thin film transistor array substrate of FIG. 5.

DETAILED DESCRIPTION OF THE PREFERRED EMBODIMENTS

Reference will now be made in detail to the preferred embodiments of the present invention, examples of which are illustrated in the accompanying drawings. Hereinafter, the preferred embodiments of the present invention will be described in detail with reference to FIG. 5 to FIG. 6E.

Figure 1:
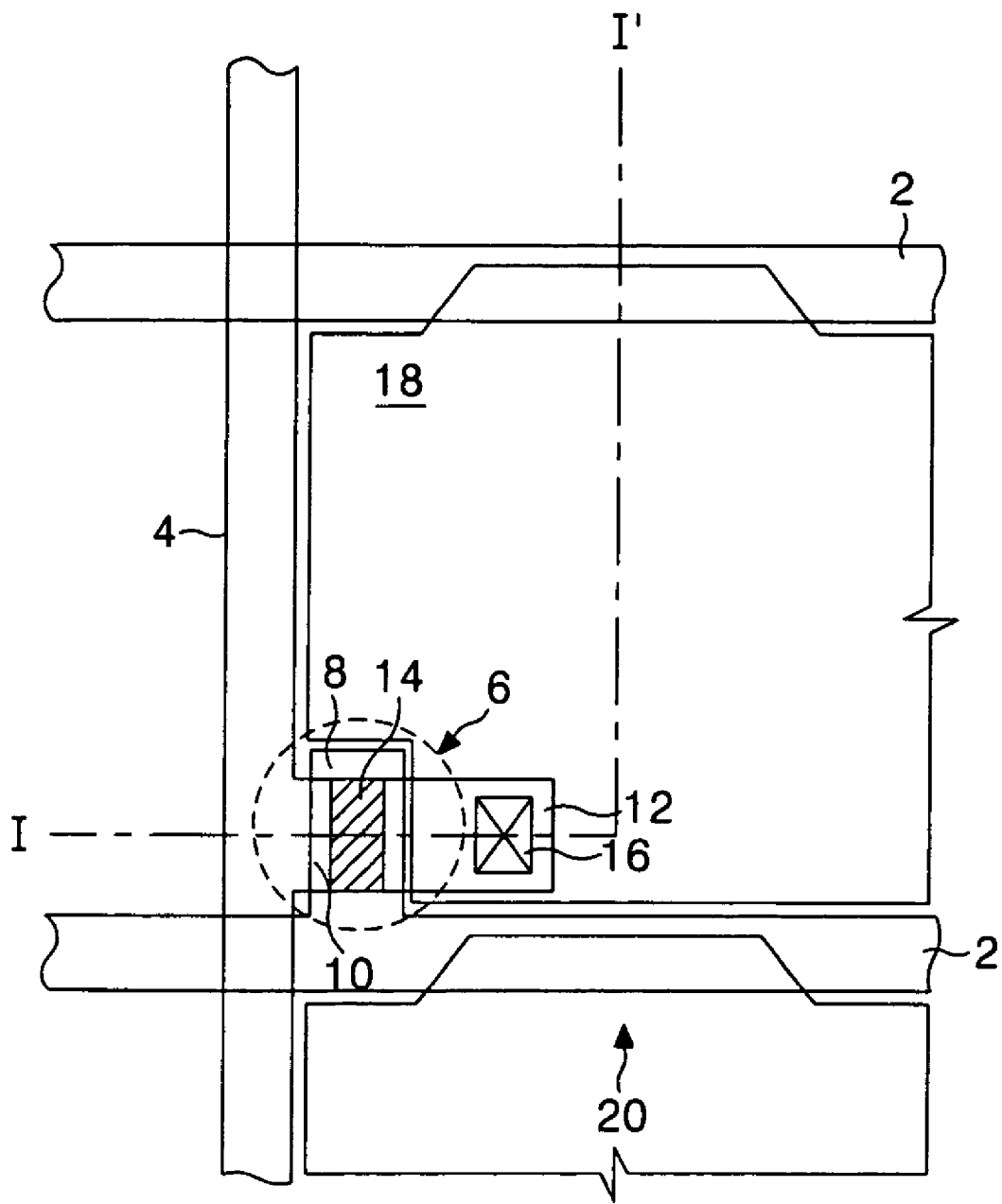
FIG. 1 is a plan view showing a portion of a general thin film transistor array substrate.
Figure 2:
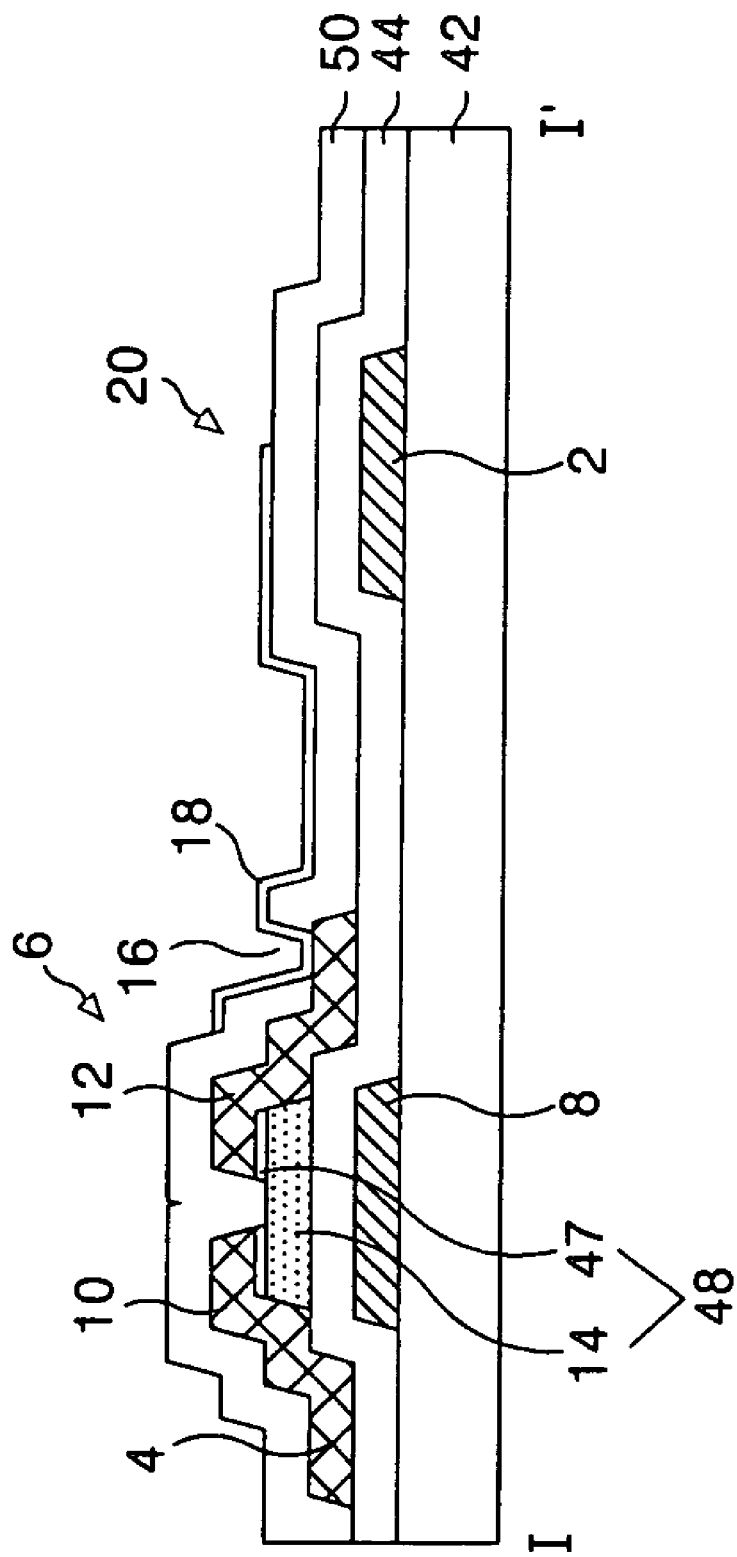
FIG. 2 is a sectional view of a related art thin film transistor array substrate taken along line I-I' of FIG. 1.
Figure 3:
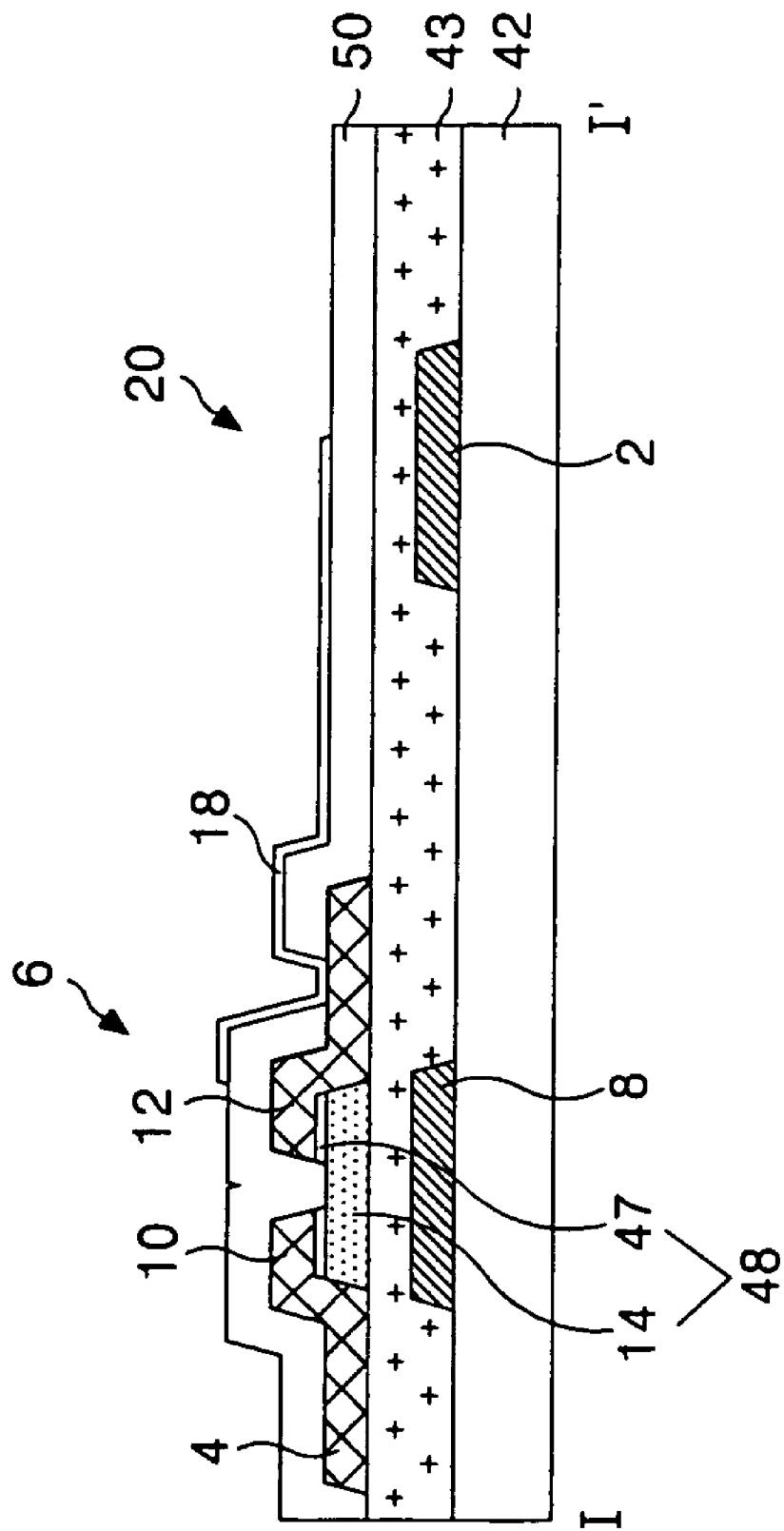
FIG. 3 is a sectional view showing a related art thin film transistor array substrate taken along line I-I' of FIG. 1 having an organic gate insulating film.
Figure 4:
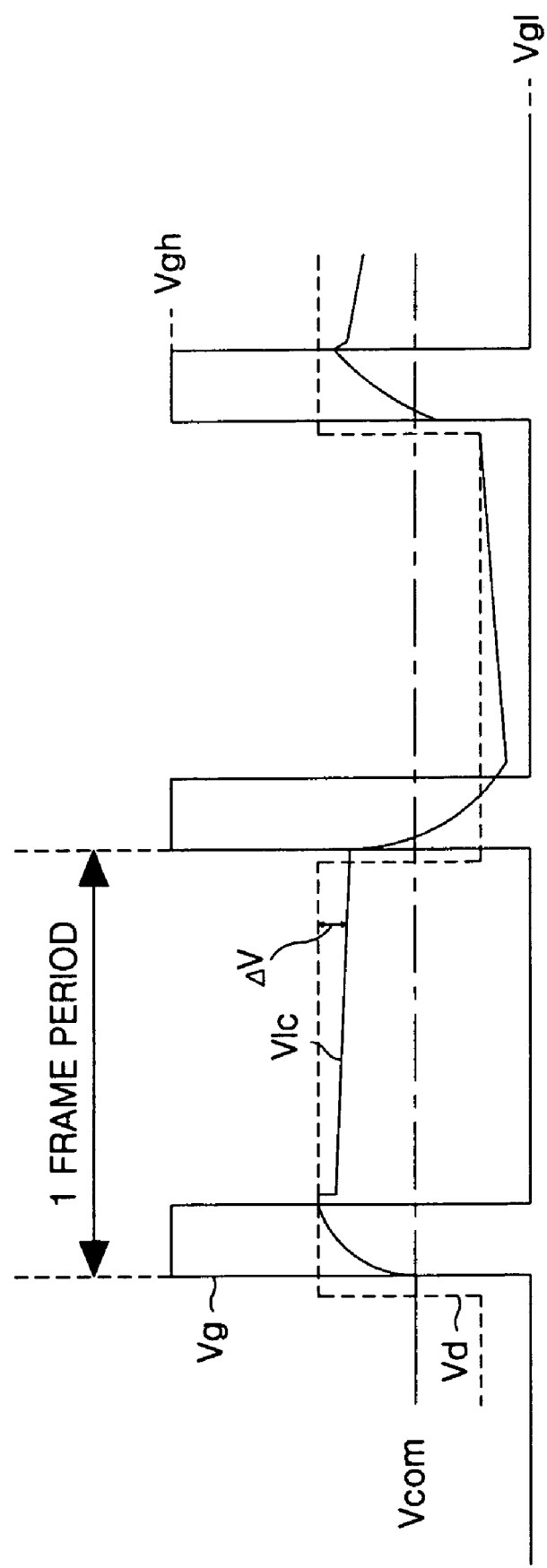
FIG. 4 is a waveform diagram showing a voltage supplied to a related art liquid crystal display panel and a driving characteristic thereof.
Figure 5:
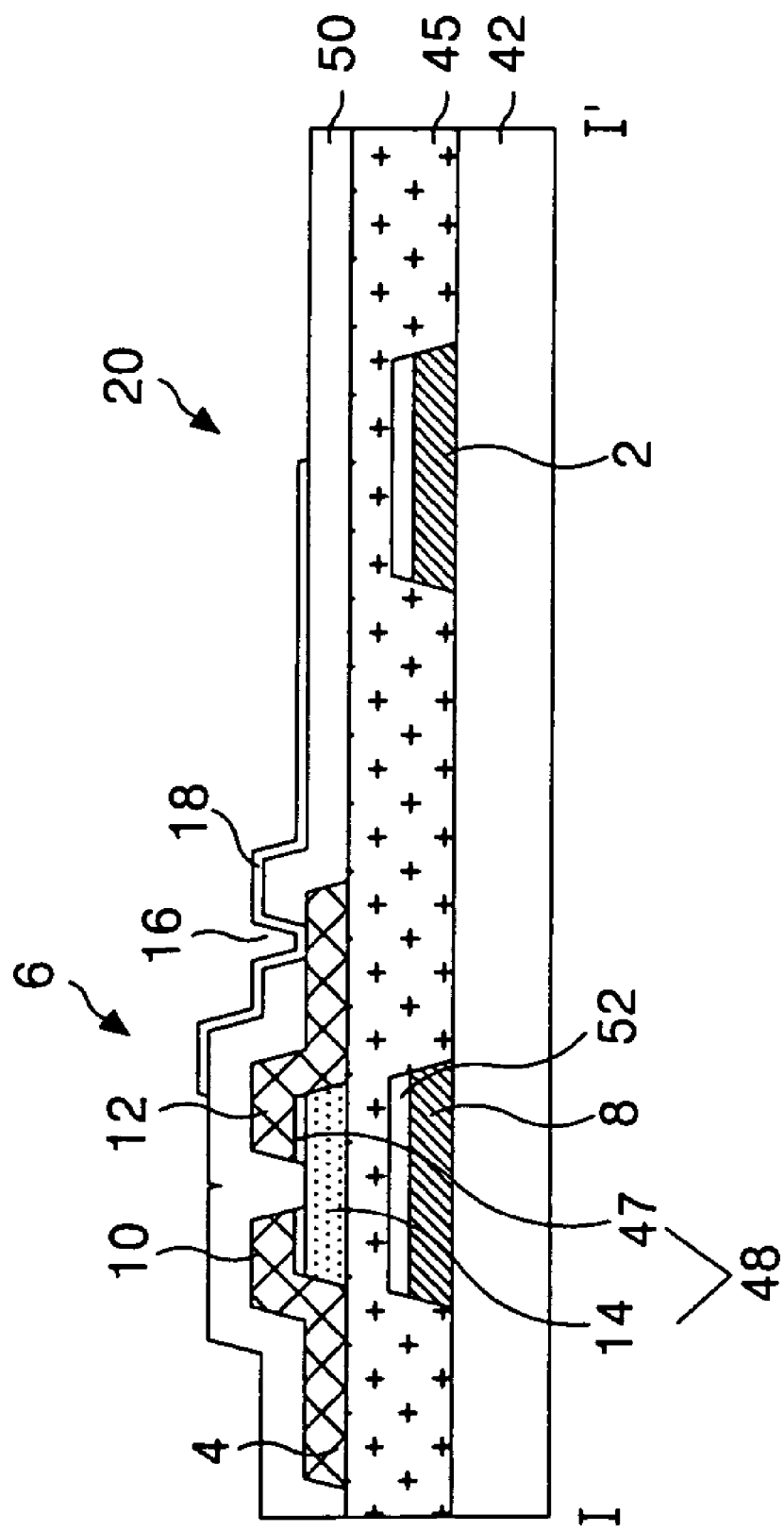
FIG. 5 is a sectional view showing an exemplary thin film transistor array substrate taken along line I-I' of FIG. 1 according to an embodiment of the present invention.

FIG. 5 is a sectional view showing a TFT array substrate according to an exemplary embodiment of the present invention. As shown in FIG. 5, the thin film transistor array substrate includes gate lines 2 and data lines 4 provided on the lower substrate 42 to intersect each other with a main gate insulating film 45 formed from an organic material therebetween, a thin film transistor 6 (hereinafter, TFT) provided at each intersection, and a pixel electrode 18 provided at a cell area defined by the crossing structure of the gate lines 2 and data lines 4. A storage capacitor 20 is provided at an overlapped portion between the pixel electrode 18 and the pre-stage gate line 2 and a sub gate insulating pattern 52 is positioned between a gate pattern such as the gate electrode 8, the gate line 2, and the main gate insulating film 45.

The pixel electrode 18 is connected to the drain electrode 12 of TFT 6 via a first contact hole 16 passing through a protective film 50. The pixel electrode 18 generates a potential difference with respect to a common electrode provided at an upper substrate (not shown) by the charged pixel voltage signal. This potential difference rotates a liquid crystal positioned between the thin film transistor array substrate and the upper substrate due to a dielectric anisotropy and transmits a light from a light source (not shown) the upper substrate through the pixel electrode 18.

The storage capacitor 20 comprises the pre-stage gate line 2, and the pixel electrode 18 overlapping with the pre-stage gate line 2 with an insulating layer of a primary third layer (that is, the material of the sub gate insulating pattern 52), the main gate insulating film 45, and the protective film 50 therebetween. The storage capacitor 20 allows a pixel voltage charged in the pixel electrode 18 to be stably maintained until the next pixel voltage is charged. The gate line 2 is connected to a gate driver via a gate pad portion (not shown), and the data line 4 is connected to a data driver via a data pad portion (not shown).

The thin film transistor 6 includes a gate electrode 8 connected to the gate line 2, a source electrode 10 connected to the data line 4, a drain electrode 12 connected to the pixel electrode 16, and an active layer 14 overlapping the gate electrode 8 and defining a channel between the source electrode 10 and the drain electrode 12. The active layer 14 is provided partially overlapping the source electrode 10 and the drain electrode 12, and further includes a channel portion between the source electrode 10 and the drain electrode 12. Ohmic contact layers 47 for making an ohmic contact respective with the source electrode 10 and the drain electrode 12 are further formed on the active layer 14. Here, the active layer 14 and the ohmic contact layer 47 form a semiconductor pattern 48.

The main gate insulating film 45 allows a gate pattern (such as the gate electrode 8 and the gate line 2) and the semiconductor pattern 48 to be electrically disconnected from each other, and allows the gate pattern and such as the source and drain electrodes 10 and 12 to be electrically disconnected from each other. Furthermore, the main gate insulating film 45 is of an organic material and plays a role to flatten the step coverage by the gate pattern (such as the gate electrode 8 and the gate line 2).

The sub gate insulating pattern 52 is formed from the same pattern as the gate pattern and is made from a ferroelectric material. Thus, a value of the parasitic capacitor $C_{gd}$ formed between the drain electrode 12 (or the source electrode 10) and the gate electrode 8 can be increased to prevent deterioration of picture quality. Also, the sub gate insulating pattern 52 plays a role in increasing a capacitance of the storage capacitor 20.

An operation and effect of the sub gate insulating pattern 52 will now be described in detail. The parasitic capacitor $C_{gd}$ provided between the drain electrode 12 (or the source electrode 10) and the gate electrode 8 with the organic gate insulating film 43 having a small dielectric constant $\epsilon$ therebetween has a small capacitance relative to the parasitic capacitor $C_{gd}$ provided with the inorganic gate insulating film 44. The reduction of $C_{gd}$ deteriorates picture quality by increasing a value of $\Delta V_p$.

To solve this in accordance with an exemplary embodiment of the present invention, the sub gate insulating pattern 52 made from the ferroelectric material is simultaneously formed from the same pattern as the gate pattern. Herein, the ferroelectric material includes any one of a material having a dielectric constant $\epsilon$ that is more than 15 such as, for example, barium strontium titanate, barium zirconate titanate, lead zirconate titanate, lead lanthanum titanate, strontium titanate, barium titanate, barium magnesium fluoride, bismuth titanate, strontium bismuth titanate, and strontium bismuth titanate niobate.

The ferroelectric material is positioned between the drain electrode 12 (or the source electrode 10) and the gate electrode 8 so that the value of the whole dielectric constant $\epsilon$ is increased. In other words, the main gate insulating film 45 and the sub gate insulating pattern 52 are positioned between the drain electrode 12 (or the source electrode 10) and the gate electrode 8 so that the whole dielectric constant $\epsilon$ has a value that is the same as a dielectric constant of the main gate insulating film 45 and a dielectric constant of the sub gate insulating pattern 52 connected in parallel with each other. For example, if the dielectric constant of the main gate insulating film 45 is approximately 3-4 and the dielectric constant of the sub gate insulating pattern 52 is approximately 15, then the whole dielectric constant is about 6~8. As a result, $C_{gd}$ is increased as compared to a related art device using only the organic gate insulating film 43. Because a value of $C_{gd}$ is increased, a value of $\Delta V_p$ is decreased. Accordingly, a residual image such as a flicker is minimized, thereby preventing a deterioration of picture quality.

Moreover, the sub gate insulating pattern 52 plays a role in increasing a capacitance of the storage capacitor 20. In other words, the sub gate insulating pattern 52 is provided to overlap the gate line 2, thereby becoming positioned between the gate line 2 and the pixel electrode 18 forming the storage capacitor 20. Accordingly, the whole dielectric constant $\epsilon$ of the storage capacitor 20 is increased and a capacitance of the storage capacitor 20 is increased. Hence the ability of the storage capacitor 20 to stably maintain a pixel voltage charged in the pixel electrode 18 until the next pixel voltage is charged is improved.

As described above, in this exemplary TFT array substrate according to the present invention, a flattening degree of the TFT array substrate is increased by adopting the main gate insulating film 45 and $C_{gd}$ is increased by including the ferroelectric sub gate insulating pattern 52 to prevent a deterioration of a picture quality. Also, a capacitance of the storage capacitor 20 is improved.

Figure 6A:
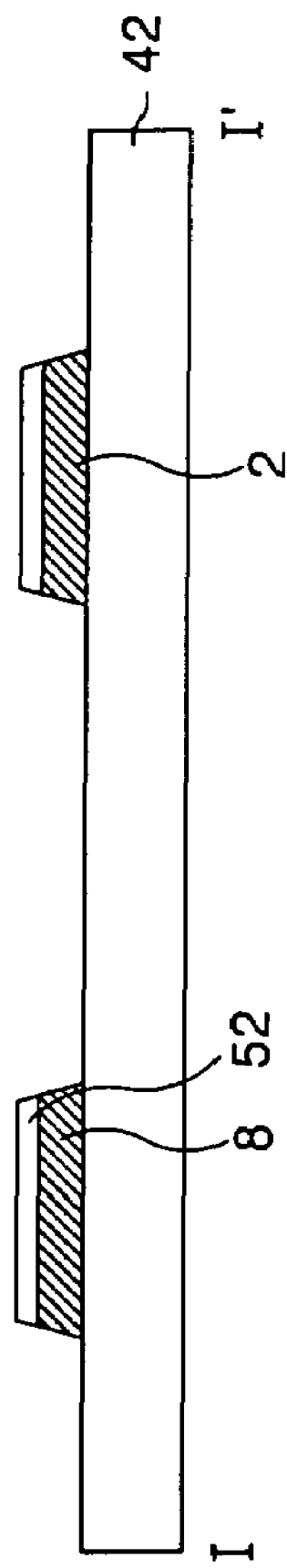

Hereinafter, an exemplary method of fabricating the thin film transistor substrate will be described in detail with reference to FIGS. 6A to 6E. First, after a gate metal layer is formed on the lower substrate 42 by a deposition technique such as sputtering, a ferroelectric inorganic layer is provided by a deposition technique such as CVD or sputtering. Next, the gate metal layer and the ferroelectric inorganic layer are patterned by a photolithography process and an etching process using a first mask, thereby providing the gate pattern including the gate line 2, the gate electrode 8, and the sub gate insulating pattern 52 overlapping the gate pattern as shown in FIG. 6A.

The gate metal has a single-layer or double-layer structure of chrome (Cr), molybdenum (Mo) or an aluminum-system metal, and the like. The ferroelectric metal material includes at least one material having a ferroelectric constant e greater than 15. More preferably, the ferroelectric metal material may include a material having a ferroelectric constant $\epsilon$ in the range of about 15-20, using for example, barium strontium titanate, barium zirconate titanate, lead zirconate titanate, lead lanthanum titanate, strontium titanate, barium titanate, barium magnesium fluoride, bismuth titanate, strontium bismuth titanate, and srontium bismuth titanate niobate.

Figure 6B:
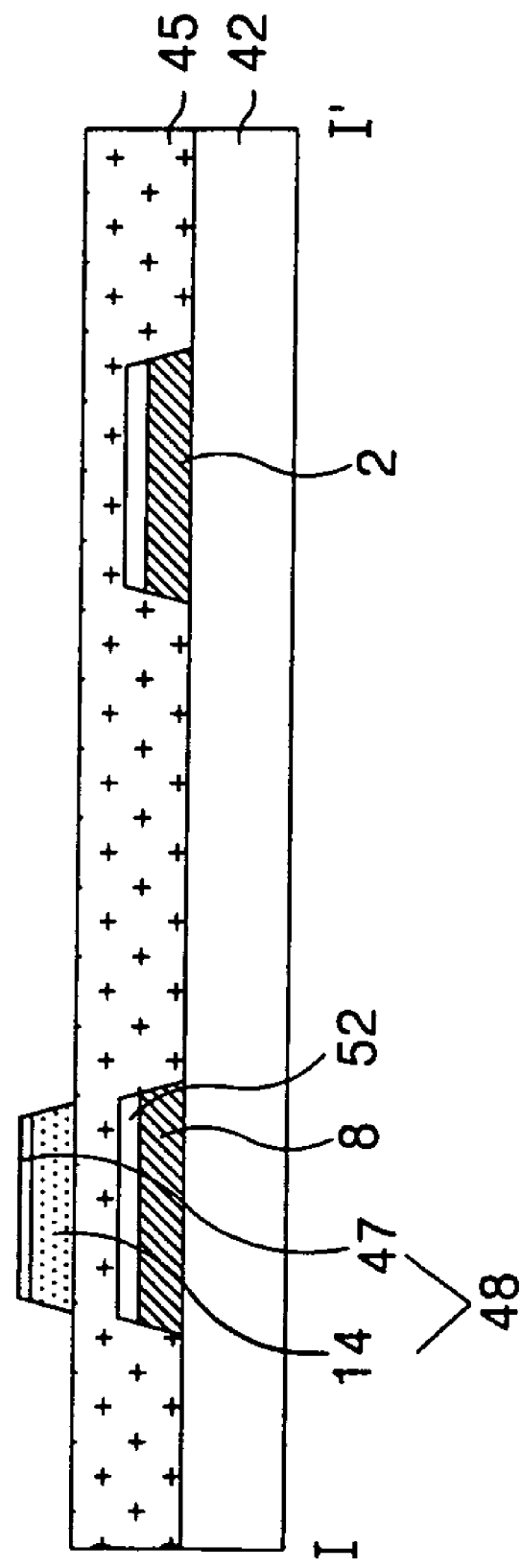

As shown in FIG. 6B, the main gate insulating film 45 is formed on the lower substrate 42 with the gate pattern and the sub gate insulating pattern 52 using a coating technique, such as a spin coating or a spinless coating. Herein, the main gate insulating film 45 is made from an organic insulating material, such as BCB or PFCB. The main gate insulating film 45 insulates the gate pattern from another electrode pattern and flattens the step coverage generated by the gate pattern and the sub gate insulating pattern 52.

An amorphous silicon layer and an n+ amorphous silicon layer are sequentially provided on the lower substrate 42 provided with the main gate insulating film 45 by a deposition technique, such as CVD or sputtering. Subsequently, the amorphous silicon layer and the n+ amorphous silicon layer are patterned by a photolithography process and an etching process using a second mask, thereby providing the semiconductor pattern 48 overlapping the gate electrode 8 with the main gate insulating film 45 therebetween as shown in FIG. 6B. Herein, the semiconductor pattern 48 includes the ohmic contact layer 47 and the active layer 14.

As shown in FIG. 6C, After the source/drain metal layer is formed on the lower substrate 42 provided with the semiconductor pattern 48 by a deposition technique, such as sputtering, the source/drain metal layer is patterned by a photolithography process and a wet-etching process using a third mask, thereby providing the source/drain patterns including the data line 4, the source electrode 10, and the drain electrode 12. Herein, in the etching process for the source/drain pattern, the ohmic contact layer 47 exposed between the source electrode 10 and the drain electrode 12 (a channel area) is also etched so that the active layer 14 of the channel area is exposed. The source/drain metal may be selected from molybdenum (Mo), a molybdenum alloy, titanium (Ti), tantalum (Ta), copper (Cu), an aluminum-system metal, or other suitable metals.

Figure 6D:
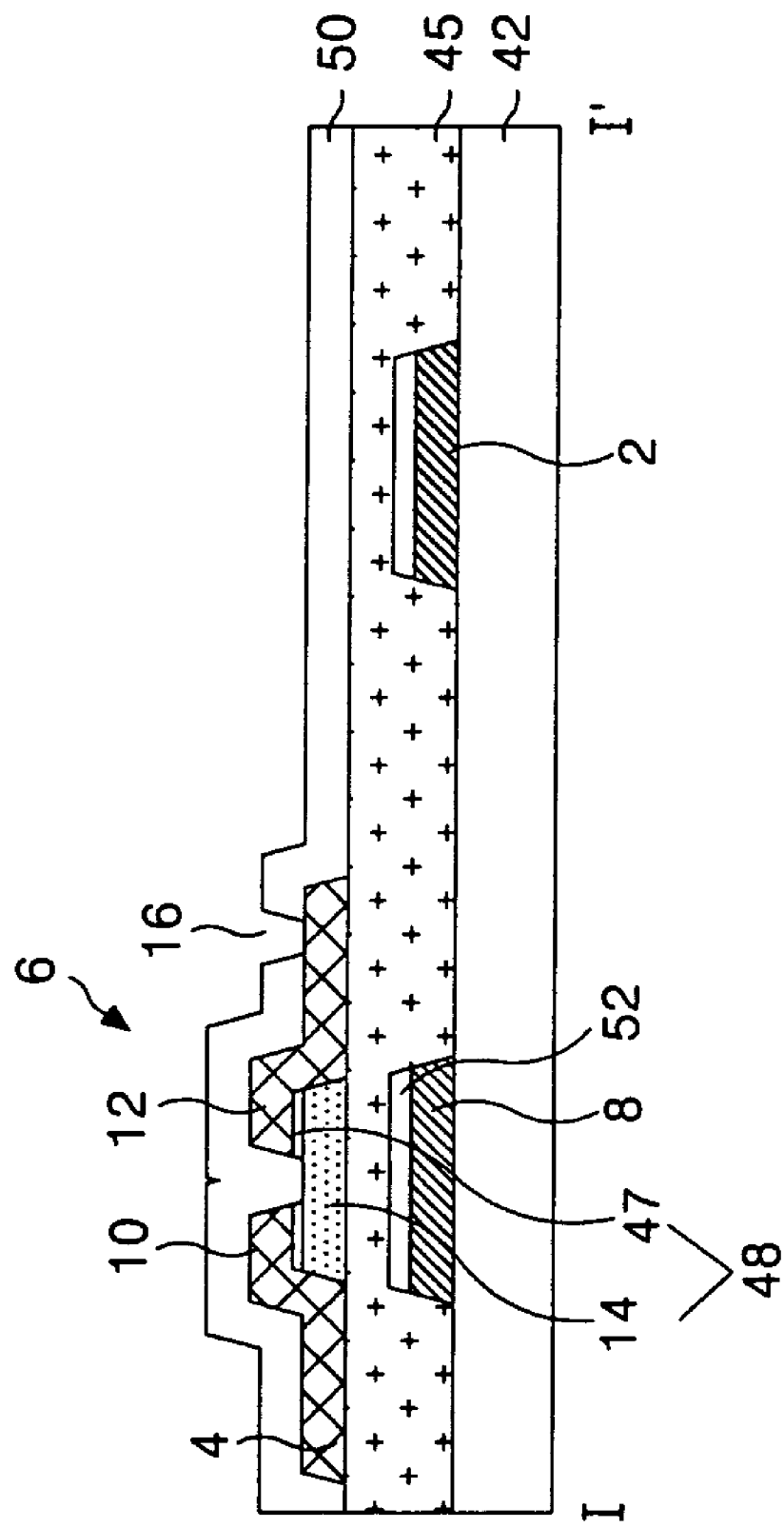
Figure 6E:
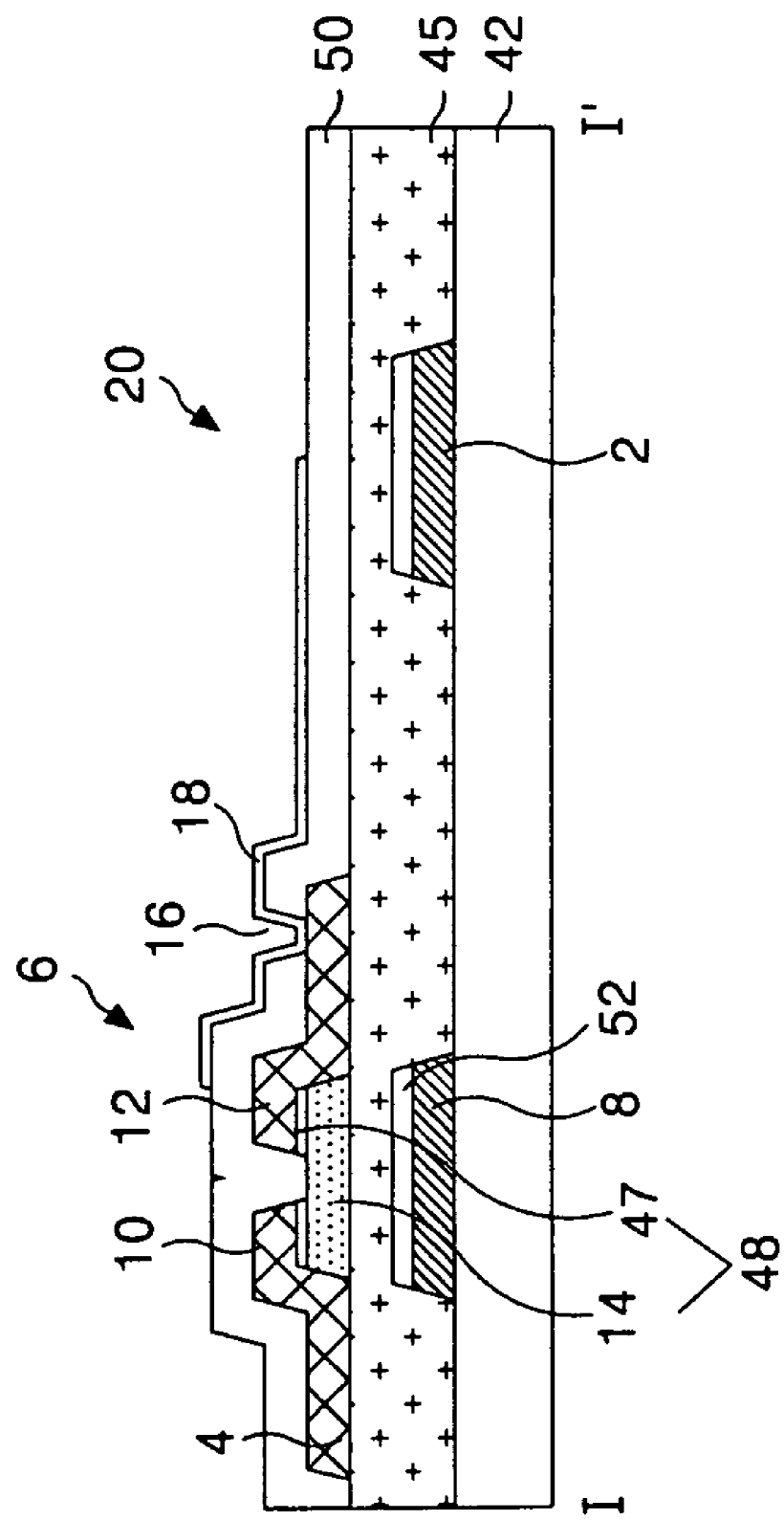

The protective film 50 is formed entirely on the lower substrate 42 provided with the source/drain patterns by the deposition technique, such as PECVD. The protective film 50 is patterned by a photolithography process and an etching process using a fourth mask, thereby defining a contact hole 16 as shown in FIG. 6D. The contact hole 16 passes through the protective film 50 to expose the drain electrode 12. The protective film 50 may be made from an inorganic insulating material or an organic insulating material, such as an acrylic organic compound, having a small dielectric constant, BCB or PFCB, etc.

As shown in FIG. E, a transparent electrode material is deposited entirely onto the protective film 50 by a deposition technique such as sputtering. Thereafter, the transparent electrode material is patterned by a photolithography process and an etching process using a fifth mask, thereby providing the pixel electrode 18 and the storage capacitor 20 having the gate line 2 and the pixel electrode 18. The pixel electrode 18 is electrically connected to the drain electrode 12 via the contact hole 16. The storage capacitor 20 includes the gate line 2 and the pixel electrode 18 with the sub gate insulating pattern 52, the main gate insulating film 45, and the protective film 50 therebetween. Herein, the transparent electrode material may be selected from indium-tin-oxide (ITO), tin-oxide (TO), or indium-zinc-oxide (IZO).

As described above, a thin film transistor array substrate and a fabricating method thereof include a primary organic gate insulating film, thereby improving the flattening of the TFT array substrate. Also, an inorganic sub gate insulating pattern formed from a ferroelectric material between a semiconductor pattern of TFT and the primary organic gate insulating film is provided, thereby increasing a capacitance of a parasitic capacitor. Accordingly, a feed-through voltage is minimized. Thus, a residual image problem, such as flicker, can be solved to improve a picture quality. Further, a ferroelectric sub gate insulating pattern is included in the storage capacitor, thereby improving a capacitance of the storage capacitor.

It will be apparent to those skilled in the art that various modifications and variations can be made in the thin film transistor array substrate and fabricating method thereof of the present invention without departing from the spirit or scope of the invention. Thus, it is intended that the present invention cover the modifications and variations of this invention provided they come within the scope of the appended claims and their equivalents.

What is claimed is:

1. A thin film transistor array substrate, comprising:
  a substrate;
  a gate pattern on the substrate, the gate pattern including a gate electrode and a gate line connected to the gate electrode;
  a main gate insulating film formed of an organic material to cover the gate pattern;
  a semiconductor pattern overlapping the gate electrode such that the main gate insulating film is disposed between semiconductor pattern and the gate line;
  a source/drain pattern on the semiconductor pattern, the source/drain pattern including a data line crossing the gate line with the main gate insulating film therebetween, a source electrode and a drain electrode, wherein thesource electrode, the drain electrode and the semiconductor pattern define a thin film transistor disposed at the intersection between the gate line and the data line;
  a protective film having a contact hole at a portion of the drain electrode;
  a pixel electrode contacting the drain electrode through the contact hole; and
  a sub gate insulating pattern disposed between the gate pattern and the main gate insulating film overlapping the gate pattern, the sub gate insulating pattern including a ferroelectric material, wherein the sub gate insulating pattern is only on the gate pattern and contacts the gate pattern, and wherein a dielectric constant of the sub gate insulating pattern is greater than a dielectric constant of the main gate insulating film, wherein the sub gate insulating pattern includes any one of lead zirconate titanate, lead lanthanum titanate, barium magnesium fluoride, bismuth titanate, strontium bismuth titanate, and strontium bismuth titanate niobate.

2. The thin film transistor array substrate as claimed in claim 1, wherein the sub gate insulating pattern, the main gate insulating film and the protective film, and the pixel electrode are disposed over the gate line to define a storage capacitor.

3. The thin film transistor array substrate as claimed in claim 1, wherein the sub gate insulating pattern has a dielectric constant between about 15 and about 20.

4. The thin film transistor array substrate as claimed in claim 1, wherein a dielectric constant of the main gate insulating film is between about 3 and about 4.

5. A thin film transistor array substrate, comprising:
a gate line;
a main gate insulating film formed over the gate line;
a data line formed on the main gate insulating film crossing the gate line such that the main gate insulating film is disposed between the gate line and the data line;
a thin film transistor provided at the intersection of the gate line and the data line, the transistor including a gate electrode extended from the gate line, a semiconductor pattern overlapping the gate electrode with the main gate insulating pattern disposed between the gate electrode and the semiconductor pattern, a source electrode connected to the data line, and a drain electrode connected to the semiconductor pattern at a portion separate from the source electrode;

a pixel electrode connected to the drain electrode of the thin film transistor; and a sub gate insulating pattern disposed between the gate pattern and the main gate insulating film overlapping the gate pattern, the sub gate insulating pattern including a ferroelectric material, wherein the sub gate insulating pattern is only on the gate pattern and contacts the gate pattern, and wherein a dielectric constant of the sub gate insulating pattern is greater than a dielectric constant of the main gate insulating film, wherein the sub gate insulating pattern includes any one of lead zirconate titanate, lead lanthanum titanate, barium magnesium fluoride, bismuth titanate, strontium bismuth titanate, and strontium bismuth titanate niobate.

6. The thin film transistor array substrate as claimed in claim 5, further comprising a protective film covering the thin film transistor and the data line, the protective film defining a hole at a portion of the drain electrode such that the pixel electrode is connected to the drain electrode through the hole.

7. The thin film transistor array substrate as claimed in claim 6, wherein the sub gate insulating pattern, the main gate insulating film and the protective film, and the pixel electrode are disposed over the gate line to define a storage capacitor.

8. The thin film transistor array substrate as claimed in claim 5, wherein a dielectric constant of the sub gate insulating pattern is between about 15 and about 20.

9. The thin film transistor array substrate as claimed in claim 5, wherein a dielectric constant of the main gate insulating film is between about 3 and about 4.

* * * * *